(12) United States Patent  
Godfrey et al.

(10) Patent No.: US 10,534,031 B2
(45) Date of Patent: Jan. 14, 2020

(54) DETECTING FAILURE LOCATIONS IN POWER CABLES

(71) Applicant: OPTASENSE HOLDINGS LIMITED, Farnborough, Hampshire (GB)

(72) Inventors: Alastair Godfrey, Farnborough (GB); Andrew Lewis, Farnborough (GB)

(73) Assignee: OPTASENSE HOLDINGS LIMITED (GB)

( * ) Notice: Subject to any disclaimer, the term of this patent is extended or adjusted under 35 U.S.C. 154(b) by 88 days.

(21) Appl. No.: 15/560,246

(22) PCT Filed: Mar. 18, 2016

(86) PCT No.: PCT/GB2016/050764
§ 371 (c)(1),
(2) Date: Sep. 21, 2017

(87) PCT Pub. No.: WO2016/151298
PCT Pub. Date: Sep. 29, 2016

(65) Prior Publication Data
US 2018/0045768 A1 Feb. 15, 2018

(30) Foreign Application Priority Data

Mar. 25, 2015 (GB) .................................. 1505082.6

(51) Int. Cl.
*G01R 31/08* (2006.01)
*G01R 31/12* (2006.01)

(52) U.S. Cl.
CPC .......... *G01R 31/083* (2013.01); *G01R 31/086* (2013.01); *G01R 31/1209* (2013.01); *G01R 31/1218* (2013.01)

(58) Field of Classification Search
CPC .... G01R 31/083; G01R 31/086; G01R 31/11; G01R 31/1218; G01R 31/1209; G01R 31/021
See application file for complete search history.

(56) References Cited

U.S. PATENT DOCUMENTS 5,178,465 A * 1/1993 Amano ................. G01R 31/088
250/227.29
10,139,433 B2 * 11/2018 Sarchi ................... G01R 15/246
(Continued)

FOREIGN PATENT DOCUMENTS

CN 103439630 12/2013
EP 0 165 803 12/1985
(Continued)

*Primary Examiner* — Minh N Tang
(74) *Attorney, Agent, or Firm* — McDonnell Boehnen Hulbert & Berghoff LLP

(57) ABSTRACT

This application relates to methods and apparatus for determining the location of a fault in a power cable of a power distribution network. The method involves monitoring at least one electrical parameter of the power distribution network to detect the occurrence of a fault and determine at least one time window for the occurrence of the fault The method involves analysing a first set of measurement signals is obtained by a distributed fibre optic sensor having a sensing optical fibre deployed along the path of the power cable. The first set of measurement signals include signals indicative of the extent of any disturbances along the sensing fibre over a known time period. The measurement shallots are analysed based on the at least one time window for measurement signals and the location of the fault in the power cable is identified based on the location of one or more longitudinal sensing portions of the sensing fibre.

21 Claims, 3 Drawing Sheets

(56) References Cited

U.S. PATENT DOCUMENTS 10,215,793 B2 * 2/2019 Hoff .................... G01R 31/021
2014/0355383 A1 * 12/2014 McEwen-King ...... G01H 9/004
367/88

FOREIGN PATENT DOCUMENTS

| EP | 2 405 279 | 1/2012 |
|---|---|---|
| GB | 2 442 745 | 4/2008 |
| JP | S61283850 | 12/1986 |
| JP | H04 351973 | 12/1992 |
| WO | WO 2012/028846 | 9/2010 |
| WO | WO 2012/137022 | 4/2011 |

* cited by examiner

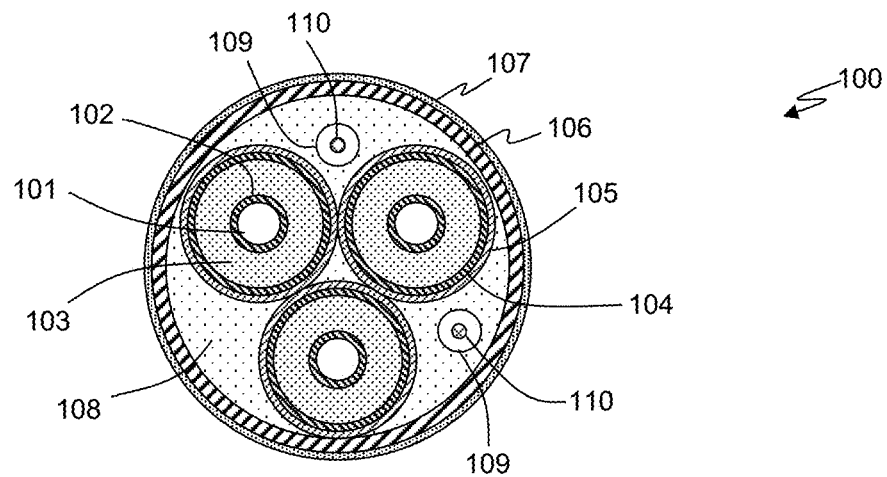
Figure 1 - PRIOR ART
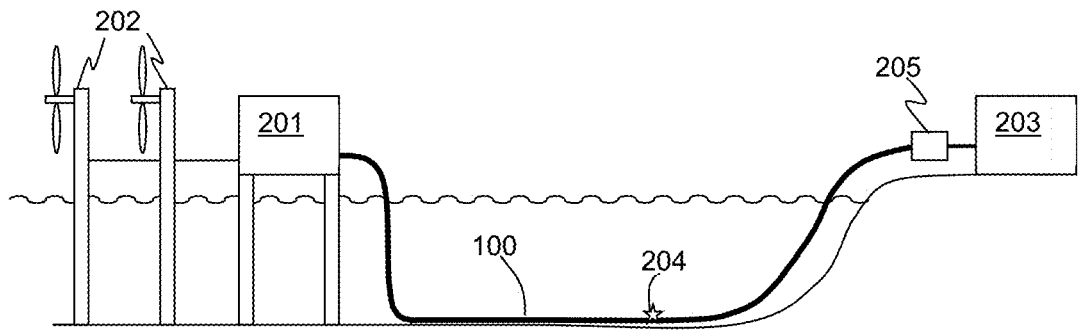
Figure 2 - PRIOR ART
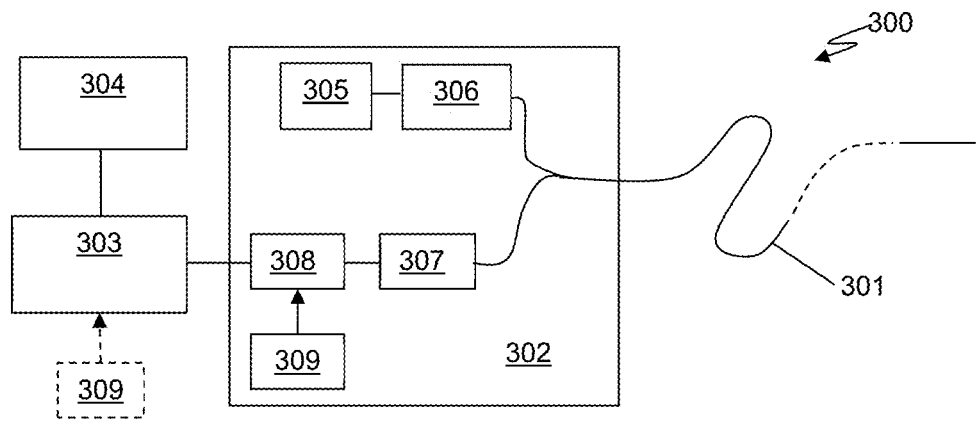
Figure 3

DETECTING FAILURE LOCATIONS IN POWER CABLES

FILED OF THE INVENTION

This application relates to methods and apparatus for detecting the location of faults in power cables, and in particular to detecting the location of current discharges.

BACKGROUND OF THE INVENTION

For power transmission over distance it is usual to transmit power over transmission lines at high voltage to reduce power losses. Typically power is transferred using high voltage AC power transmission. Three phase AC transmission is the most common, although for supplying some remote areas fewer phases, such as a single phase supply may be used.

On land, outside of urban areas it is typical to transmit power using high voltage AC power distribution using overhead transmission lines. The various conducting lines are suspended so as to be sufficiently far above the ground and away from one another to provide electrical isolation, i.e. the surrounding air acts as an insulator.

In some instances however such overhead lines may not be practical or appropriate. For instance in urban environments it may be desired to transmit and distribute power using buried cables rather than overhead lines. For transmission of power across bodies of water it may also be better to use submarine power cables. This is becoming increasingly of interest with the growing popularity of offshore power generation, e.g. offshore wind farms and the like.

In a power distribution cable it is necessary to insulate the conductors that are used for power transfer from one another and also from the environment. FIG. 1 illustrates the general principles of such power cables and shows a cross-section of one example of a power cable 100 such as may be used, for example, for medium or high voltage AC power transmission, i.e. voltages of tens of possible hundreds of kilovolts.

FIG. 1 illustrates that the cable may have three conductors 101, one for each AC phase, each of which may, for example, be formed from copper or a similar material. The conductors are each sheathed by at least one semi-conductive layer 102 which is surrounded by a respective insulator 103 such as XLPE (cross-linked polyethylene). Each insulator 103 may be surrounded by one or more sheathing layers 104 and 105, which may, for example include at least one semi-conductive sheathing layer 104. For a high voltage cable, layer 105 could be a lead sheath for example whereas for a medium voltage application layer the layer 105 may be a copper screen. It will be understood by one skilled in the art there may be additional or alternative sheathing layers such as semi-conductive polyethylene, aluminium tape, a conductive counter-helix or the like and/or other layers such as swelling tape surrounding the insulator. The sheathing layers, i.e. 102, 104 and/or 105, are arranged to provide electric shielding to shield the other conductors and the environment from any electric field generated by the current flowing in the conductors in use.

The three conductors, with their associated sheathing and insulation layers, are all contained within an armour layer 106 which may for instance comprise a braiding of galvanised steel wires to provide protection for the power cable. The power cable may also have an outer jacket layer 107 such as a polypropylene yarn cladding.

There may be filler material 108 within the cable, which may comprise a plurality of elongate filler elements disposed inward of the armour layer 106. This can give the overall power cable a desired form and ensure the sheathed conductors are held in place within the power cable, as well as providing additional padding/protection.

Additionally it is common to embed at least one optical fibre within the cable, or at least provide the ability for optical fibres to be located within the power cable, for instance to allow for data communication between the various power stations linked by the cable. Thus there may be at least one fibre optic conduit 109 for carrying one or more optical fibres 110, and typically a bundle of optical fibres.

It will be appreciated of course that whilst FIG. 1 shows a single cable 100 comprising three conductors for the respective AC phases, it is possible for each AC phase to be supplied through a separate, single-phase, power cable, which therefore typically has the same general structure as that shown in FIG. 1 but with only one conductor and its associated sheathing and insulation layers (and correspondingly less filler). Such single-phase power cables may sometimes be bound together before deployment. It will also be appreciated that whilst high voltage AC remains the most common power transmission, high voltage DC transmission is also being increasing considered for certain applications, such as power transfer from offshore power generation. High voltage DC may also be transmitted over power cables similar to those illustrated in FIG. 1, with insulation designed to withstand the constant fields generated by the constant DC voltage. Such DC cables may have a single conductor (for an earth ground return) or two conductors, e.g. for a bipolar scheme.

As mentioned above such power cables may be used in various applications and one example is for power transmission from an offshore power generation site, such as a wind farm, as illustrated in FIG. 2. FIG. 2 illustrates that a first power station 201, which in this example may be located on an offshore platform, may be connected to a local source of power, such as a plurality of wind turbines 202. The first power station 201 may receive electrical power from the wind turbines and in some instances transform the voltage to a high voltage for transmission to an on-shore power station 203 via power cable 100. Power cable 100 may be deployed to run along the sea-bed to shore. In examples such as this wind farm example the first power station 201 may be several kilometres or several tens of kilometres from shore.

In use the conductors of the power cable 100 may carry very high voltages, of the order of hundreds of kilovolts for example. Thus good quality insulation is required. In some instances defects resulting from the manufacturing processes and/or degradation of the properties of the insulation over time can result in the insulator failing with a resultant current discharge.

In some instances the insulation may fail such that there is a discharge between conductors of the cable, or between a conductor and the environment, i.e. earth. This can result in a high voltage discharge with a significant fault current, e.g. arcing. Typically such a fault may result in a catastrophic failure of the relevant part of the cable, with potentially explosive failure of the cable. FIG. 2 illustrates a cable insulation failure and catastrophic fault at location 204. This will generally result in power transmission through the cable having to be stopped until the cable can be repaired, for instance by opening one or more high voltage circuit breakers 205.

Power cables of the type described above can be very costly and thus simply replacing the entire cable or providing redundant power cables that can be used in the event of failure of one cable may not be practical. Thus, in the event of a fault, it is typically necessary to repair the cable by removing the damaged section and splicing in a new section of cable. This requires locating the damaged section. However detecting which part of a say 30 km length of subsea cable is damaged is not a trivial endeavour.

For example to undertake visual inspection would require raising progressive sections of cable to the surface for inspection and possible repair, e.g. starting from shore, until the damaged section 204 was found or employing divers or a submersible vehicle to scan the length of the cable until the fault is found. This may take significant time and, as mentioned above, power transmission may be halted until the cable is repaired. Usually it is desired to have power outage for as short a time as possible. Often the cable may be buried 1 or 2 m below the sediment on the sea floor, therefore difficult to examine.

In some instances, prior to a complete failure of the insulation the cable may experience partial discharge. Partial discharge, as will be well understood by one skilled in the art of power cables, is a discharge, such as a gas discharge that does not complete a bridge between the conductors. For power cable insulation partial discharge may occur in cavities or other defects in the insulation. Thus partial discharge occurs, and may regularly occur, at the location of a fault in the power cable. A fault that leads to partial discharge is (not yet) catastrophic, but it is understood that some faults that initially lead to partial discharge can worsen over time and eventually lead to catastrophic failure.

Detection of partial discharges may therefore be an indication that there is a fault with the insulation of a power cable and/or the insulation is in the process of failing. Monitoring for partial discharge is thus sometimes used to determine the health of a power cable system and identify any points of possible failure. A section of power cable where significant partial discharge is occurring could therefore be replaced as part of a planned maintenance before it fails. Planned maintenance is far less disruptive than catastrophic failure and may allow a smaller section of the power cable to be replaced.

Partial discharge can be identified by looking for high frequency effects in the electrical properties of the cable when at voltage. However locating where the partial discharge is occurring is more difficult. One method is based on Time Domain Reflectometry (TDR) of pulses in the cable conductor. However the TDR techniques can't usually be performed whilst the cable is being used for transfer of power and such techniques typically only work on relatively short lengths of cable and the presence of multiple partial discharge sites can confuse the measurements as the various pulses from the partial discharge can superimpose.

Partial discharge can be detected by the use of an external inductively coupled sensor but typically it is not economical to permanently embed such sensors with a power cable. Thus upon manufacture a power cable may be subject to a factory partial discharge test to identify any manufacturing defects prior to installation but detecting the location of partial discharge that develops in a cable that has been deployed remains challenging.

There is therefore a desire to be able to rapidly identify the location of a fault resulting in a current discharge along a power cable, whether a fault leading to partial discharge or a catastrophic fault.

SUMMARY OF THE INVENTION

Thus according to the present invention there is provided a method of determining the location of a fault in a power cable of a power distribution network comprising:

monitoring at least one electrical parameter of the power distribution network to detect the occurrence of a fault in the power cable and determine at least one time window for the occurrence of the fault;

taking a first set of measurement signals obtained by a distributed fibre optic sensor having a sensing optical fibre deployed along the path of said power cable;

wherein the first set of measurement signals comprise signals indicative of the extent of any disturbances on each of a plurality of longitudinal sensing portions of the sensing fibre over a known time period;

analysing the first set of measurement signals based on said at least one time window for measurement signals indicative of a fault in the power cable; and identifying the location of the fault in the power cable based on the location of one or more longitudinal sensing portions of the sensing fibre giving rise to the measurement signals indicative of a fault in the power cable.

The method of the present invention thus monitors electrical parameters of the power cable or the network to which the power cable is connected to detect a fault. There a number of ways in which a fault can be detected in an electrical network as will be explained in more detail later. In the event of a fault the location of the fault is determined by making use of data acquired by a fibre optic distributed sensor having a sensing fibre deployed along the length of the power cable.

Fibre optic distributed sensing is a known technique that has been used in a variety of applications. Embodiments may be implemented using Rayleigh backscatter based distributed fibre optic sensors, which can be implemented as distributed acoustic sensors. The first set of measurement signals may therefore comprise signals indicative of the extent of any acoustic disturbances on the longitudinal sensing portions of the sensing fibre. As will be described in more detail later such sensor may additionally or alternatively be capable of detecting dynamic temperature variations and thus the first set of measurement signals may comprise signals indicative of the extent of any temperature variations the longitudinal sensing portions of the sensing fibre.

In some embodiments the sensing fibre may comprise a magnetically sensitised optical fibre. As will be described in more detail later by use of such a sensitised fibre the same principles can be used to detect dynamic strains induced by varying magnetic fields and thus the first set of measurement signals comprise signals indicative of the extent of any variations in magnetic field acting on the longitudinal sensing portions of the sensing fibre.

In the event of a fault with the power cable a relatively large discharge of energy may occur, as mentioned above. This may create a significant acoustic impulse, and/or result in significant heating of that section of the cable and/or produce relatively intense varying magnetic fields. As such it may be possible to locate the fault event by analysing the first set of measurement signals. To analyse just the measurement signals may be difficult however and/or result in false alarms. In the present invention therefore the fault is detected using an electrical approach and at least one time window for the fault occurrence is identified and then the measurement signals are analysed based on the identified time window(s).

The first set of measurement signals may therefore comprise a time stamp indicating when the measurement signals were acquired, so that the appropriate signals can be analysed when the relevant time window(s) for the fault are established.

In some embodiments detecting the occurrence of a fault may comprise detecting that at least one electrical parameter exhibits a fault characteristic. Determining at least one time window for the occurrence of the fault may comprise defining at least one or a start time and an end time for the time window based on the time that the electrical parameter exhibits the fault characteristic. Both a start time and an end time may be defined separately or one of a start time or an end time may be defined for a time window of a predetermined duration.

In some embodiments the at least one electrical parameter may comprise a state of the circuit breaker and the fault characteristic is the circuit breaker opening. The start of the time window may be defined to be a first time before the circuit breaker opened. This first time may correspond to a maximum time between inception of a fault and resultant opening of the circuit breaker. The end of the time window may be defined to be the time that the circuit breaker opened, although in some embodiments the end time may be before the circuit breaker opens, e.g. such that the time window is a time window for the fault starting. In some embodiments the end of the time window may be defined to be after the circuit breaker opened, e.g. to correspond to a time required for the stored energy in the power cable to dissipate.

In some embodiments the at least one electrical parameter may comprise a state of a control signal for the circuit breaker and the fault characteristic may thus be the issuance of a control signal to command the circuit breaker to open. The start of the time window may be defined as a first time before issuance of a control signal to command the circuit breaker to open. The first time may be defined based on expected processing and detection delays.

In some embodiments the at least one electrical parameter comprises a voltage and/or current through the power cable. Detecting a fault could involve detecting a current or voltage magnitude or amplitude above or below a threshold.

Having identified a start time for the time window the method may comprise identifying an end time for the time window. In some embodiments the time window may have a predetermined duration. In some embodiments however the end time of the time window may be defined first.

Analysing the first set of measurement signals based on said at least one time window for measurement signals indicative of a fault in the power cable may comprise identifying any measurement signals having a significant change during the time window and identifying the relevant sensing portions as a candidate fault location. The significant change could be indicative of at least one of an intense acoustic impulse, a rapid change in temperature and/or a sudden variation in magnetic field.

In some embodiments the method may further comprise analysing the evolution of the measurement signals during and/or after the time window from the sensing portions at said candidate fault location to detect a characteristic fault signal. For example the characteristic acoustic signal in the event of a fault could be a sudden impulse when the fault occurs, with intense acoustic activity continuing until the time at which the circuit breaker opens. By looking for a characteristic fault signature any ambiguity between possible candidate fault locations may be resolved and/or confidence in the identified location may be improved. In addition the evolution of the signal may provide information about the type of fault. The method may therefore further comprise categorising the type of fault based on the characteristic fault signal.

In some embodiments analysing the first set of measurement signals based on said at least one time window for measurement signals indicative of a fault in the power cable may comprise correlating the electrical properties of the cable with the measurement signals during the time window.

In some embodiments the first set of measurement signals may comprise signals indicative of the extent of any acoustic disturbances on the longitudinal sensing portions of the sensing fibre and analysing the first set of measurement signals based on the at least one time window for measurement signals indicative of a fault in the power cable may comprise analysing the measurement signals for an acoustic disturbance propagating in both directions along the power cable that originates from a first location during said time window. The acoustic stimulus created by the fault occurring may result in acoustic stimuli travelling in both directions along the cable. This will excite successive sensing portions of the sensing fibre in turn, based on the propagation speed of the acoustic waves in the power cable and/or surrounding environment. Detecting such propagating signals, which will result in a characteristic chevron or "V" shape in a waterfall plot of the measurement signals, can be indicative of the fault location.

The method may be used to detect the location of catastrophic faults. In some embodiments however the method may additionally or alternatively be used to locate partial discharge faults. Thus the step of monitoring at least one electrical parameter of the power distribution network to detect the occurrence of a fault in the power cable may comprise detecting the occurrence of partial discharge.

The method may comprise monitoring the current and/or voltage of the cable to detect electrical pulses associated with partial discharge. The electrical pulses may be detected using a partial discharge monitor, e.g. a high frequency current transformer and suitable signal processor or the like.

In some embodiment for detecting partial discharge the method may comprise applying a ramp voltage, which may for instance be a specially applied test voltage ramp, and determining an end time for said time window for the occurrence of the fault based on the time at which said electrical pulses start to be detected. The start time of said time window may be determined based on the expected propagation speed of pulses in the power cable, i.e. to allow time for pulses to have been detected from the distal end of the power cable. One time window may be determined for the whole cable or the different sections of the power cable may have different time windows based on the propagation time from that section of power cable.

In some embodiments the method may comprise operating the power cable with an AC voltage and determining at least one time window for each AC cycle based on the duration over which said electrical pulses are detected in each AC cycle. Analysing the first set of measurement signals for measurement signals indicative of a fault in the power cable may then comprise identifying a measurement signal for a sensing portion that exhibits a pattern of increased activity that starts and ends in correspondence with the time windows. Again the time window for a section of power cable may depend on its position.

The method described above may be applied in near real time as soon as a fault is detected. However provided that the relevant data has been acquired previously the method may be applied some time after a fault has occurred in order to detect the location of the fault. The step of taking the first set of measurement data may thus involve taking data from a suitable memory or computer readable data store. The method may be applied by apparatus at the location of the power cable but in some instances the method may be applied in a control room which may be remote from the power cable and the distributed fibre optic sensor.

For a real-time application the method may further comprise the step of performing distributed fibre optic sensing on said sensing fibre to obtain said first set of measurement signals. Performing distributed fibre optic sensing may comprise repeatedly interrogating said sensing fibre with coherent optical radiation, detecting radiation which is Rayleigh backscattered from within said sensing fibre, and analysing said detected backscatter radiation to derive the first set of measurement signals.

The method may further comprise providing a time stamp from a timer for each of said measurement signals, for example from a GPS clock.

The power cable may be a submarine power cable but the method is applicable to any type of power distribution cable, especially for medium and high voltages.

The invention may be implemented by a suitable processor. Thus in another aspect there is provided machine readable code stored on a non-transitory storage medium comprising instructions for causing a suitable processor to perform the method in any of the variants described above.

Aspects also relate to fault detection apparatus. Thus in another aspect there is provided an apparatus for locating the location of a fault on a power cable of a power distribution network comprising:
- a monitor for monitoring at least one electrical parameter of the power distribution network to detect the occurrence of a fault in the power cable and determine at least one time window for the occurrence of the fault; and
- a fault locator configured to analyse a first set of measurement signals obtained by a distributed fibre optic sensor having a sensing optical fibre deployed along the path of said power cable;
- wherein the first set of measurement signals comprise signals indicative of the extent of any disturbances on each of a plurality of longitudinal sensing portions of the sensing fibre over a known time period; and
- wherein said fault locator comprises a processor configured to:
analyse the first set of measurement signals based on said at least one time window for measurement signals indicative of a fault in the power cable; and
identify the location of the fault in the power cable based on the location of one or more longitudinal sensing portions of the sensing fibre giving rise to the measurement signals indicative of a fault in the power cable.

The apparatus may comprise a distributed fibre optic sensor for acquiring the first set of measurement signals. The distributed fibre optic sensor may comprise an interrogator unit for repeatedly interrogating said sensing fibre with coherent optical radiation, detecting radiation which is Rayleigh backscattered from within said sensing fibre, and analysing said detected backscatter radiation to derive the first set of measurement signals. The distributed fibre optic sensor may be operable as a distributed acoustic sensor to acquire measurement signals indicative of the extent of any acoustic disturbances on the longitudinal sensing portions of the sensing fibre. The distributed fibre optic sensor may additionally or alternatively be operable to acquire measurement signals indicative of the extent of any temperature variations the longitudinal sensing portions of the sensing fibre. In some embodiments the sensing fibre may comprise a magnetically sensitised optical fibre and the distributed fibre optic sensor may be operable to acquire measurement signals indicative of the extent of any variations in magnetic field acting on the longitudinal sensing portions of the sensing fibre.

The apparatus may comprise a timer for applying a time stamp to the measurement signals indicating when the measurement signals were acquired. The timer may be a GPS clock.

The fault locator may be configured to analyses the measurement signals according to any of the variants of the methods described above.

The apparatus may form part of a power distribution network. The power cable may be a submarine power cable.

DESCRIPTION OF THE DRAWINGS

To aid in further understanding, the invention will now be described by way of example only with reference to the accompanying drawings, of which:

FIG. 1 illustrates a cross-section of an example of a known type of power cable;

FIG. 2 illustrates a power cable for power transmission experiencing a fault;

FIG. 3 illustrates a Rayleigh backscatter distributed fibre optic sensor;

DESCRIPTION OF THE INVENTION

Figure 4:
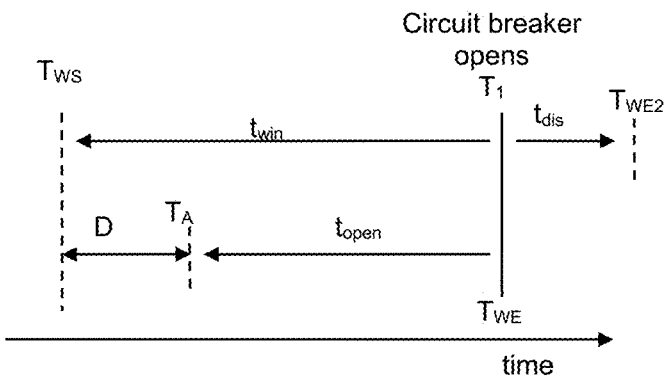
FIG. 4 illustrate identification of a time window of fault occurrence.

As described above FIG. 2 illustrates an example of a power cable 100 that experiences a fault 204 at a location along the power cable. The fault could be a breakdown of insulation resulting in bridging or arcing between the conductors of the cable and or/the surrounding environment of the cable. For high and medium voltage systems of several tens or even hundreds of kilovolts this can result in a large discharge with relatively high current being discharged through at least part of the power cable structure. This can result in catastrophic failure of the power cable and result in power transmission through the power cable having to be halted, e.g. by opening breaker 205, until the faulted section can be repaired, usually be replacing the relevant section of cable. Locating the relevant section of power cable to replace may not be straightforward however, especially with a submarine power cable that may be several tens of kilometres in length.

Embodiments of the invention thus use distributed fibre optic sensing, and in particular distributed fibre optic sensing based on coherent Rayleigh backscatter, to aid in determining the location of a current discharge, and hence a fault, in a power cable.

Distributed fibre optic sensing is a known technique where an optical fibre is deployed as a sensing fibre and interrogated with optical radiation. Backscatter from within the optical fibre in response to the interrogating radiation is detected and analysed to determine environmental stimuli acting on the fibre. By an appropriate choice of interrogating radiation and analysis the sensing fibre can be effectively divided into a plurality of discrete longitudinal portions.

One particular form of such sensor used in embodiments of the invention uses coherent interrogating radiation and detects any such radiation which undergoes Rayleigh scattering from within the fibre due to the scattering sites inherent in the optical fibre.

FIG. 3 illustrates the principles of such a distributed fibre optic sensor 300. A length of sensing optical fibre 301 is removably connected at one end to an interrogator 302. The output from interrogator 302 is, in some embodiments, passed to a signal processor 303, which may be co-located with or integrated into the interrogator or may be remote therefrom. Optionally there may also be a user interface/graphical display 304, which may be may be co-located with the signal processor or may be remote therefrom and in practice may be realised by an appropriately specified PC. The sensing fibre 301 can be many kilometres in length and can be, for instance be up to 40 km or more in length.

The sensing fibre may be a standard, unmodified single mode optic fibre such as is routinely used in telecommunications applications without the need for deliberately introduced reflection sites such a fibre Bragg grating or the like. The ability to use an unmodified length of standard optical fibre to provide sensing means that low cost readily available fibre may be used. However in some embodiments the optical fibre may comprise a fibre structure which has been fabricated to be especially sensitive to incident vibrations, or as will be described later, to be sensitive to varying magnetic fields. The optical fibre will typically be protected by containing it with a cable structure, possibly as part of a bundle of optical fibres.

In use the sensing fibre 301 is deployed in an area of interest to be monitored which, in the present invention is along the path of a power cable. The sensing fibre may be separate to the power cable and arranged to run generally along the length of the power cable. For instance a separate sensing fibre optic cable may be located to run alongside the power cable, for instance laid alongside the power cable, say within a few metres of the power cable, or attached to the outside of the power cable. In some embodiments the sensing fibre could form part of the power cable structure and may, for instance, comprise an optical fibre already present in a power cable, such as one of the one or more optical fibres 110 as illustrated in FIG. 1.

In operation the interrogator 302 launches interrogating coherent electromagnetic radiation into the sensing fibre. The sensing fibre may, for instance, be repeatedly interrogated with pulses of optical radiation. In some embodiments a single pulse of optical radiation may be used for each interrogation, although in some embodiments multiple pulses may be used, in which case the optical pulses may have a frequency pattern as described in GB2,442,745 or optical characteristics such as described in WO2012/137022, the contents of which are hereby incorporated by reference thereto. Note that as used herein the term "optical" is not restricted to the visible spectrum and optical radiation includes infrared radiation and ultraviolet radiation. Any reference to "light" should also be construed accordingly.

The interrogator may therefore have at least one laser 305 and may comprise at least one optical modulator 306 for producing optical pulses. The interrogator also comprises at least one photodetector 307 arranged to detect radiation which is Rayleigh backscattered from the intrinsic scattering sites within the fibre 301. The signal from the photodetector may be processed by a processing module 308 of the interrogator unit to provide a measurement signal which is representative of disturbances acting on the fibre.

The phenomenon of Rayleigh backscattering results in some fraction of the interrogating optical radiation launched into the fibre being reflected back to the interrogator. As the interrogating radiation is coherent the Rayleigh backscatter received back at the interrogator at any instant is an interference signal of the backscatter generated within the sensing fibre from a particular position in the fibre. It will be noted this Rayleigh backscatter is generated by interaction between the interrogating radiation and inherent scatting sites present within the optical fibre. Thus the sensing function may be effectively distributed throughout the whole sensing fibre (although the returns are processed in time bins to provide results from individual sensing portions of the fibre). Such a sensor is therefore referred to as a distributed fibre optic sensor as the sensing is distributed throughout and intrinsic to the fibre itself. This is in contrast to sensors that used fibres having fibre Bragg gratings (FBGs) or similar deliberately introduced extrinsic reflection sites where the sensing function is provided in defined areas, typically as a point sensor.

The processing effectively divides the detected backscatter into a series of time bins based on the time after launch of the interrogating radiation. Each time bin may therefore corresponds to a different longitudinal sensing portion located at a different distance along the sensing fibre.

The backscatter radiation received at the detector for any given sensing portion of the optical fibre will depend on the distribution of the intrinsic sites within that portion of fibre, which is essential random. Thus the backscatter from one longitudinal sensing portion to the next will vary in a random fashion. However in the absence of an environmental stimulus acting on that section of the sensing fibre the backscatter signal received from one particular sensing portion will be the same from one interrogation to the next (assuming the characteristics of the interrogating radiation do not vary). However any disturbance on a given portion of the sensing fibre which results in a change of effective optical path of such sensing portion will alter the relative distribution of scattering sites and vary the interference signal from that section.

Thus the processing may analyse the backscatter from each of a plurality of sensing portions of the sensing fibre to detect variations in the backscatter between interrogations and use such variation as an indication of a disturbance acting on the fibre.

In some embodiments, especially those that use a single optical pulse per interrogation, the processing may look at the intensity of the backscatter from a given sensing portion. In some embodiments however, especially those that use two spatially separated pulses per interrogation, the processing may determine a phase value for the interference signal received at the photodetector from a given sensing portion (or a demodulated version of the interference signal). The processor module may therefore demodulate the returned signal, e.g. based on any frequency difference between the optical pulses. The interrogator may operate as described in GB2,442,745 or WO2012/137022 for example or as described in WO2012/137021. The processor module may also apply a phase unwrap algorithm.

It will therefore be clear that dynamic disturbances or changes acting on the fibre that result in a change of effective optical path length can therefore be detected in each of a plurality of sensing portions of the optical fibre.

Such changes may be dynamic strains due to mechanical disturbances on the optical fibre, for instance from incident pressure waves. The distributed fibre optic sensor may therefore be operable as a distributed acoustic sensor which generates measurement signals indicative of acoustic disturbances acting on sensing portions of the sensing fibre. Note that as used herein the term acoustic shall be taken to mean any type of pressure wave or varying strain generated on the optical fibre and for the avoidance of doubt the term acoustic will be used in the specification to include mechanical vibrations.

Such changes may also be due to temperature variations resulting in an effective path length change of the fibre, e.g. by thermal expansion and/or a refractive index modulation. The distributed fibre optic sensor may therefore be operable as a distributed temperature change sensor which generates measurement signals indicative of temperature variations affecting sensing portions of the sensing fibre. It should be noted that such a sensor only provides measurements indicative of the extent of any change in temperature and does not provide any information on the absolute temperature. Typically such thermal variations may have a relatively low frequency, e.g. of the order of a few Hz or lower and the relevant measurement signals of interest, e.g. acoustic or temperature change, can be determined by looking at the measurement signals in an appropriate frequency band. Indeed conventionally for a distributed acoustic sensor the signals below a certain cut-off frequency are typically filtered out to leave only acoustic signals of interest.

The form of the optical input and the method of detection thus allows a single continuous optical fibre to be spatially resolved into discrete longitudinal sensing portions. That is, the measurement signal sensed at one sensing portion can be provided substantially independently of the sensed signal at an adjacent portion. As mentioned such a sensor may be seen as a fully distributed or intrinsic sensor, as it uses the intrinsic scattering processed inherent in an optical fibre and thus distributes the sensing function throughout the whole of the optical fibre. The spatial resolution of the sensing portions of optical fibre may, for example, be approximately 10 m or so, which for a continuous length of fibre of the order of 10 km say could provide 1000 independent channels along the length of the optical fibre.

As the sensing optical fibre is relatively inexpensive the sensing fibre may be deployed in a location in a permanent fashion as the costs of leaving the fibre in situ are not significant.

As mentioned above in embodiments of the present invention the sensing fibre is deployed along the path of a power cable to be monitored and in particular may be deployed within the power cable, i.e. the sensing fibre 301 may be a suitable optical fibre running through a conduit 109 of the power cable illustrated in FIG. 1. A Rayleigh backscatter distributed fibre optic sensor interrogator unit 302 may be connected to one end of the sensing fibre, e.g. at power station 201 or power station 203, to monitor the cable in use to detect disturbances acting on the sensing fibre, in particular to perform distributed acoustic sensing. Thus up to 40 km or so of power cable could be monitored by a single interrogator which may be located on shore for example. For power cables of up to 80 km or length or so two interrogators could be arranged, one at each end of the power cable, i.e. one on the off-shore platform and one on shore. To avoid interference each interrogator could interrogate a separate sensing fibre within the power cable.

As mentioned above a fault in a power cable that results in a discharge between conductors, or between a conductor and the environment, can result in a catastrophic failure of a cable. This may be a relatively violent event that could result in a relatively intense mechanical shock being delivered to the power cable at the fault location. By performing distributed acoustic sensing any disturbance of the sensing portions of the sensing fibre in the vicinity of the fault can be detected. As the position of each of the sensing portions along the sensing fibre is known, by detecting which sensing portions exhibit a disturbance indicative of a current discharge the location of the fault along the sensing fibre and hence along the power cable can be determined.

In order to correct identify a disturbance on the sensing fibre that corresponds to a power cable fault, embodiments of the present invention monitor at least one electrical parameter of the power distribution network to detect the occurrence of a fault in the power cable and determine at least one time window for the occurrence of the fault. Measurement signals from the distributed fibre optic sensor corresponding to the identified time window(s) are then analysed for measurement signals indicative of a power cable fault.

In this way data regarding the electrical characteristics of the power network is effectively compared or correlated with the data from the distributed acoustic sensor. This can provide accurate detection of the timing and location along the power cable of the fault.

In some embodiments an electrical parameter monitored may be a parameter associated with a circuit breaker, such as the state of the circuit breaker, i.e. open or close, or state of a control input. As described above in the event of a power cable fault the current through the faulted conductor may rise rapidly and cause a circuit breaker 205 to operate. The circuit breaker may operate automatically based on its own monitoring circuitry or may be under control of some higher level fault controller. The circuit breaker opening could therefore be used as an indication of a fault. The characteristics of the circuit breakers and how long they take to operate are typically well known and thus the time window of when the fault occurred could be determined to be a certain defined time window prior to the circuit breaker operating.

For example FIG. 4 illustrates how the relevant time window may be determined based on the time of opening of a circuit breaker. At a certain time, $T_1$, the circuit breaker opens as the result of a fault. Depending on which circuit breaker(s) of the power network open it may be identified that the fault is a fault in the power cable.

Based on the time of opening of the circuit breaker $T_1$ at least one time window having a start time $T_{WS}$ and an end time $T_{WE}$ may be defined. The time window may be defined in various different ways.

For instance based on the time $T_1$ that the circuit breaker opens a start time for the time window $T_{WS}$ may be defined at a certain time $t_{win}$ earlier. The time $t_{win}$ may be based on the type of circuit breaker and the likely time required for the fault to be detected and the circuit breaker to operate to open in the event of a fault. The time $t_{win}$ may be predetermined based on the type of breaker and may for instance correspond to the expected maximum time between inception of a fault and the circuit breaker opening. The end of the time window $T_{WE}$ may be taken to be the time $T_1$ at which the breaker opens to extinguish the fault.

Such a time window would thus correspond to the period of most fault activity, in terms of discharge and flow of fault current, at the fault location.

In some instance however it may additionally or alternatively be desired to determine a time window specifically for when a fault start.

For instance, based on the type of circuit breaker a minimum time for the breaker to open in response to a fault, $t_{open}$, may be identified. This may be a predetermined value previously determined for the relevant circuit breaker or it may be determined based on the present operating conditions. It will be appreciated that the actual time taken for the breaker to open may vary in practice due to the prevailing operating conditions and/or, for an AC breaker, the point in the phase cycle at which the fault occurs—most AC breakers are arranged to wait until the AC current/voltage is at or near a zero crossing to open to avoid significant arcing. The minimum time for opening, $t_{open}$, may be used to define a time $T_A$ by which the fault must have started. The time of start of the time window $T_{WS}$ may be defined as described above, with the difference between $T_{WS}$ and $T_A$ being a first time window of duration D. The first time window thus corresponds to a window when start of the fault is detected. Alternatively in some embodiments the start of the time window $T_{WS}$ may be determined using the minimum time of opening $t_{win}$ and a predetermined duration, D, which may be of the order of a few milliseconds or so, and may be based on the type of breaker and the range of opening times likely and/or an expected time between fault inception and the breaker being triggered.

As mentioned above the end of the time window may be determined by the time $T_1$ at which the circuit breaker opens. However it will be appreciated that there will typically still be stored energy in the power cable even after the circuit breaker trips and such stored energy will need to dissipate, which could lead to a continued discharge after the circuit breaker trips. In some embodiments the end of a time window $T_{WE2}$ may be defined to be some time, $t_{dis}$ after the circuit breaker trips, with the time $t_{dis}$ corresponding to the expected time required for the stored energy to dissipate and the fault discharge to extinguish.

It will be appreciated however that the time window for likely fault occurrence could instead be defined based on a control signal being generated to command the circuit breaker to open. The time window could thus be determined as a time window having a predefined relationship to the issuing of a command for the circuit breaker to open. In this instance the time window may be defined in a similar fashion as discussed above in relation to FIG. 4 but, instead of using an expected time of opening of the breaker to define the time of the start of the window, some other predetermined duration related to the time between fault inception and issuing of the breaker open command may be used. The end of the time window could occur a certain time after issuance of the command to open the circuit breaker.

In some embodiments in addition to or instead of using the state or control state of a circuit breaker to identify a fault, an electrical parameter of power flow through the power cable may be monitored, e.g. a parameter of current flow through the power cable or a voltage associated with the power cable. For instance the magnitude of maximum current flow through the power cable and/or the maximum voltage and/or voltage magnitude could be monitored. A sudden or unexpected change which is sufficiently different from normal operation could be used to determine the occurrence of a fault. The time window for the fault could be identified by defining a time window of predetermined duration in a predetermined relationship to the time at which the disturbance in the electrical parameter is identified in a similar fashion as discussed above. For instance if the current increased above a threshold value a time window of predefined duration may be defined based on the time of threshold crossing.

However a fault has been detected and the time window for the fault occurrence defined, the acoustic signals from the distributed acoustic sensor can then be analysed to determine whether any sensing portions registered a relatively intense acoustic impulse within that time window.

By narrowing the analysis of the measurement signals from the distributed acoustic sensor to those signals corresponding to the identified time window, which is based on the fault occurrence, the analysis of the measurement signals can be relatively simple and no complex false alarm processing is required, as would be the case if the acoustic measurement signals alone were analysed.

It has been found that especially for a sensing optical fibre located within or alongside a submarine power cable the surrounding environment can be relatively noisy. Being underwater the optical fibre may be subject to constant movement due to the water movement, which can result in relatively low frequency strains on the sensing fibre at all time and may cause the power cable to be dragged across or into features on the seabed resulting in acoustic impulses. Marine life or submerged objects may interact with the power cable generating impulses in the sensing fibre optic.

However as the time window of the fault can be determined, e.g. by the timing of the circuit breaker operating, a large number of irrelevant acoustic events can be ignored. The measurement signals from the sensing portions of the sensing fibre may be analysed based around the identified time window of likely fault occurrence. The analysis may look for a relatively intense acoustic impulse within the time window.

Figure 5:
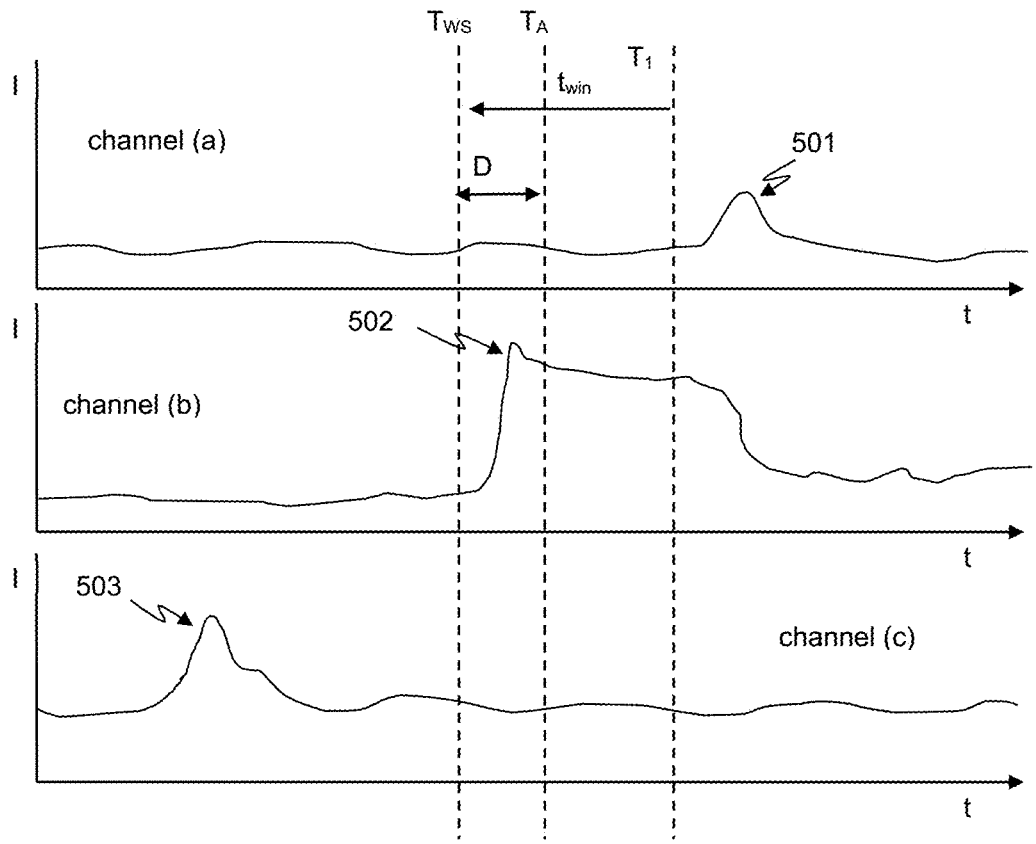
FIG. 5 illustrates analysing measurement signals from a distributed fibre optic sensor based on the time window.

FIG. 5 illustrates the principles of time analysis of the measurement signals of the distributed fibre optic sensors. FIG. 5 illustrates plots of detected acoustic intensity against time for three different channels of the distributed fibre optic sensor, i.e. the measurement signals corresponding to three different sensing portions located at different locations along the power cable. It will of course be appreciated that in practice the signals for a plurality of sensing portions from all along the relevant length of the sensing fibre optic may be analysed and there may be hundreds or thousands of channels.

At a time $T_1$ the circuit breaker opens indicating a fault in the power cable. A time window for the fault occurrence is identified as discussed above in relation to FIG. 4, for instance by defining a start time $T_{WS}$ for the time window at a time $t_{win}$ before the circuit breaker opens. It can be seen that for channel (a), i.e. for a first sensing portion at a first location along the length of the power cable the detected acoustic intensity acting on the sensing fibre is relatively constant over time and shows no unusual activity in the relevant time window. There is a feature 501 which corresponds to increased acoustic activity after the likely time window—this could for instance be due to sound propagating along the power cable from the fault location. However there is no relevant activity in the time window.

For channel (b), i.e. for a second sensing portion at a second different location along the sensing fibre, and hence the power cable, there is a significant and rapid impulse 502 within the time window for the fault. This could indicate that the fault occurred at this location.

Channel (c), which relates to a third sensing portion at a third location, shows an acoustic impulse 503 but significantly outside of the relevant time window. This impulse is not related to the fault and thus be focussing on the identified time window such an unrelated acoustic event can be easily discounted and ignored.

For the example illustrated in FIG. 5 the location of the fault can therefore be clearly identified by the measurement signals associated with channel (b), i.e. from the second sensing portion at the second location. It will therefore be clear that the measurement signals within the time window may be analysed to detect an indication of the fault. As mentioned above in practice the measurement signals from all the sensing portions would be analysed and it would be expected that the sensing portions adjacent the second sensing portion may show increased acoustic activity within the time window, which may provide additional confidence that the fault location has been correctly identified.

For acoustic measurement signals it may also be the case that a catastrophic fault results in a large acoustic stimulus being delivered to the structure of the power cable. This acoustic stimulus may propagate in both directions along the power cable and/or the environment surrounding the power cable, with a certain propagation speed (depending on the relevant material). The result will be a disturbance that originates at a given location of the sensing fibre and the spreads away from that location in both directions with a relatively well defined speed. This result will be a series of disturbances of successive sensing portions of the sensing fibre over time. In a waterfall plot of acoustic intensity, having location along the sensing fibre along one axis and time on the other axis, such a signal would show up as a characteristic chevron or "V" shape. In some embodiments therefore the method may involve analysing acoustic signals from a distributed acoustic sensor to detect signals indicative of a disturbance that occurs at a first location during the identified time window and which propagates away from the first location in both directions along the power cable, and hence the sensing fibre, with a relatively constant speed, i.e. looking for the characteristic chevron or "V" shape. The method may involve looking for signals propagating at a predetermined speed corresponding to the speed of sound in part of the cable material, e.g. a cable conductor material for example.

Referring back to the measurement signals from channel (b), the sensing portion at the location of the fault, in this example the increased acoustic activity following impulse 502 continues for the rest of the time window and continues until time $T_1$, which could correspond to acoustic energy generated by the continuing discharge until the circuit breaker open and the fault current is extinguished, after any stored energy is dissipated. Thus whilst the analysis of the measurement signals could simply look for any relatively intense acoustic activity within the time window, in some embodiments the evolution of the measurement signal for the relevant sensing portion in and around the identified time window may be analysed to determine whether it matches an expected characteristic. This may for instance involve correlating the monitored electrical parameters and the measurement signals from the distributed fibre optic sensor, e.g. the acoustic signal. For instance the voltage and/or current level of the power cable during the fault may be analysed and correlated with the acoustic signals to provide confidence that the acoustic signal does indeed correspond to the signal generated by the fault.

Additionally or alternatively a time window for the likely start of the fault could be identified as discussed above in relation to FIG. 4, for example by determining a time $T_A$ by which the fault must have occurred in order for the circuit breaker to open. By looking for an acoustic signal with an impulse during this window D confidence that the detected acoustic signal corresponds to the fault may be improved.

Additionally or alternatively analysis of the acoustic measurement signal may provide additional information about the likely type of fault and the damage caused. Thus having identified the fault location the acoustic signals could be analysed to provide information about the fault event, for instance to categorise the type of fault.

Thus in some embodiments if a given sensing portion is identified as a candidate fault location the measurement signals acquired around the time window may also be analysed to improve confidence and/or provide more information about the type of fault.

In order that the measurement signals from the sensing portions of the distributed fibre optic sensor can be analysed with respect to an identified time window of a fault it is necessary to ensure that the time of acquisition of the measurement signals is accurately recorded.

Referring back to FIG. 3 in embodiments of the invention therefore the distributed fibre optic sensor integrator unit may comprise an accurate timer 309 for providing a clock signal that can be recorded with the measurement signals. In some embodiments the timer may be a GPS based clock. GPS based clocks that derive a time signal from GPS satellites are known. In embodiments of the present invention a GPS timer 309 may therefore provide a time stamp to either the data from the photodetector, or more likely the output of processing module 308.

It should be noted that FIG. 3 indicates that the timer 309 is part of the interrogator unit but in some embodiments the timer could be separate thereto and may supply a time signal to the interrogator unit, or in some embodiments where an external processor 303 is connected to the interrogator unit and in the same location (so there is no significant timing latency) the timer 309 could provide a time signal to the external processor.

The discussion so far has focussed on distributed acoustic sensing. However as mentioned previously a Rayleigh backscatter distributed fibre optic sensor may also be capable of responding to dynamic temperature variations. In the event of a fault resulting in a discharge between the conductor of a power cable and another conductor or the environment a relatively large amount of energy may flow through the structure of the power cable which may result in significant heating. In some embodiments therefore the measurement signals may be indicative of temperature variations acting on the sensing fibre. The signals due to temperature variation, as will be understood by one skilled in the art, are mainly concentrated in the low frequency bands, e.g. of the order of a few Hz or lower. For a conventional distributed acoustic sensor such signals may mainly be seen as noise and filtered out. However it is possible to determine such signals to give an indication of temperature changes or other low frequency strains. The principle would be the same as described above although once a first time window of the fault occurrence is identified the measurement signals may be analysed within a second time window, the second time window being based on the first time window and likely thermal rise and decay times given the power cable structure and materials.

In some embodiments the sensing fibre may be one where at least one or more sections of the sensing fibre have been made sensitive to magnetic field variations such as described in WO2012/028846. This document describes that a sensing optical fibre may be coupled to a material, such as a magnetostrictive material, which reacts to an applied magnetic field in such a manner that a varying magnetic field produces a dynamic strain on the optical fibre. As described above a Rayleigh backscatter distributed fibre optic sensor will respond to dynamic strains. Thus such a sensor can be seen as a distributed fibre optic sensor for varying magnetic fields.

Figure 6:
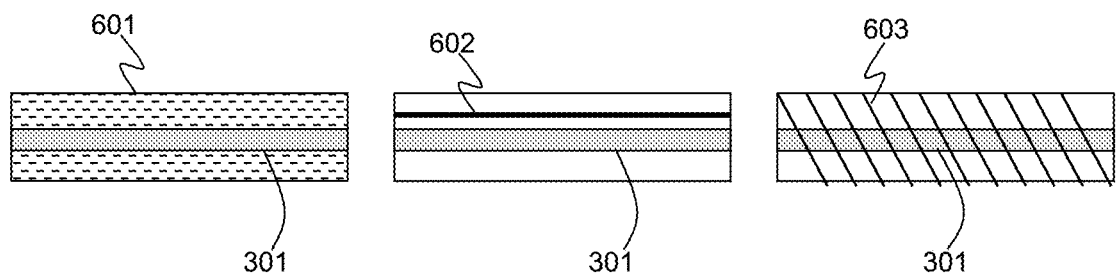
FIG. 6 illustrates a magnetically sensitised sensing fibre that may be used in embodiments of the invention.

The magnetostrictive material may be arranged so that its dimensions change anisotropically, so that flux in one dimension only may selectively be detected. Mechanical contact between the optical fibre and the magnetically responsive material may be achieved in various ways such as illustrated in FIG. 6. For instance a sensing optical fibre 301 may have a coating 601 which comprises magnetically responsive material, e.g. as particles in the form of powder or anisotropic particles in a binder material, which may for example be a polymer or adhesive. Additionally or alternatively the magnetically responsive material may comprise at least one wire 602 of magnetostrictive material disposed along at least part of optical fibre, e.g. co-extruded in a jacket material. In some embodiments the magnetically responsive material may comprise a material 603 braided around and coupled to the optic fibre. In any of these embodiments the magnetically responsive material may comprise a metal, such as nickel.

Such a sensing fibre will thus react to dynamic magnetic field variations acting on a sensing portion and the measurement signal will thus be a measurement signal of any changes in magnetic field.

If such a sensing cable were applied in an AC power cable then in use the magnetically responsive material would react to the varying magnetic fields produced by all the conductors of the cable. The screening layers around the conductors of the power cable tend to shield any electrical field emission from the power cable but a varying magnetic field may be produced. The magnetic field produced by each conductor will vary with AC phase cycle and the resultant combined field on the sensing fibre will depend on its position in the cable. In normal use however the varying signal detected by the magnetically sensitive sensing fibre will vary the same way from one phase cycle to the next as the direction of current flow is co-axial with the conductors. Thus a normal variation for each sensing portion of the sensing fibre in use can be determined.

In the event of a fault however there will be a relatively large fault current flow in a direction having a component radial to the conductors. This will result in a magnetic field quite different to that experienced in normal operation. Thus the magnetically sensitised fibre can be used in a similar way as described above in relation to acoustic sensing. A fault may be detected, e.g. by a circuit breaker opening, and a time window for the fault detected. Within the relevant time window the measurement signals for the distributed fibre optic sensor which indicate varying magnetic field can be analysed for an anomaly. At the fault location the magnetic field will vary significantly at the time of fault due to the large discharge. This can be detected and used to identify the fault location in a similar fashion as described above.

For DC cables the magnetic field generated in use would not be expected to vary much in use in normal operation, only with the amount of current flow. In a fault however the radial discharge would result in varying magnetic fields that could be detected.

It will be appreciated that at the fault location a magnetically sensitised sensing fibre may also be subject to acoustic vibrations, which would also create dynamic strains in the sensing fibre. WO2012/028846 suggests that a second length of sensing fibre which is not magnetically sensitised may be deployed alongside the first magnetically sensitised sensing fibre to detect any acoustic disturbances. The signals detected by the second fibre can be subtracted from those detected by the first fibre to provide an indication of the varying magnetic field alone. Such an approach could also be adopted in embodiments of the present invention and the signals from the two sensing fibres would thus provide an indication of both acoustic and magnetic disturbances acting on a sensing portion (and also optionally temperature changes). This may allow accurate fault location with a high degree of confidence and also provide useful information about what happened at the fault site when the fault occurred.

In some embodiments however it may not matter that the magnetic signal can not be separated from an acoustic signal. If all that is required is detection of a significant disturbance within the relevant time window then using a magnetically sensitised fibre may allow detection of any large disturbance whether magnetic or acoustic (or thermal).

The discussion above has focussed so far on identification of the location of a catastrophic fault with a complete discharge. Embodiments of the invention are also useful for detecting the location of partial discharge.

As discussed above a partial discharge may occur in a cavity or defect in the insulation. Partial discharge will typically produce a series of relatively high frequency pulses in the conductor of the power cable which can be detected. Such pulses can be detected in use by so called "on-line" monitoring methods but it is challenging to be able to detect the location of the partial discharge. Embodiments of the present invention can identify the location of partial discharge over a long length of cable and even if there are multiple partial discharge sites.

A partial discharge, although not as violent as the catastrophic failure discussed so far, will still result in a sudden discharge of energy resulting in an acoustic noise or vibration which can be detected by a distributed acoustic sensor. The partial discharge within the insulation will result in heating which can be detected by looking for dynamic temperature variations. The partial discharge will also be accompanied by a disturbance of the normal magnetic field variation. Thus any, some or all of the techniques described above can be used to detect a partial discharge in the power cable.

Partial discharge is different to the catastrophic failure described previously as the power network may continue to operate as normal with partial discharge occurring. Once partial discharge is initiated at a given location it may be sustained for as long as the voltage remains high enough.

Figure 7:
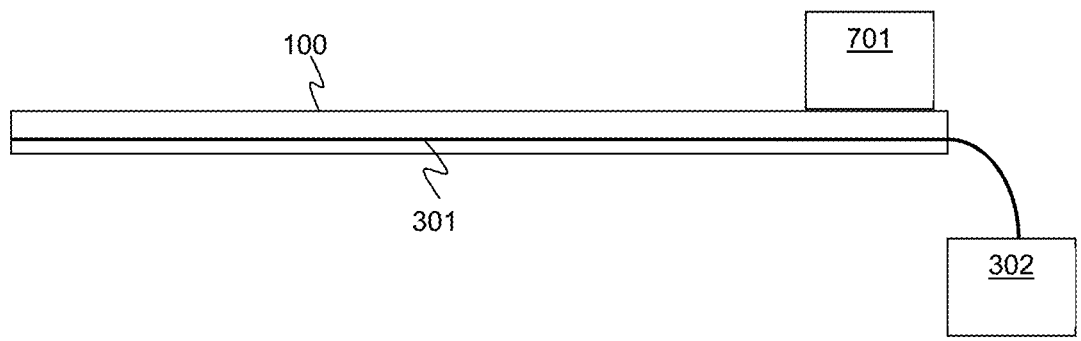
FIG. 7 illustrates a fault location apparatus according to an embodiment of the invention.

In some embodiments therefore the electrical parameters of the power cable may be monitored to detect partial discharge events. The electrical parameters may be the current through the power cable conductor(s) and detecting a partial discharge may be detecting pulses associated with current discharge. In some embodiments the electrical parameter may be current through a partial discharge monitoring device, such as a high frequency current transformer (HFCT). HFCTs are known for monitoring for pulses associated with partial discharge in a power cable. FIG. 7 illustrates a power cable 100 that is connected at one end to a partial discharge monitor 701 for detecting pulses due to partial discharge, e.g. a HFCT. The power cable 100 comprises a sensing fibre 301 as described above connected to a distributed fibre optic sensor interrogator unit 302.

In use the partial discharge monitor 701 operates to detect the occurrence of any pulses in the power cable conductor(s) due to partial discharge. The partial discharge monitor may be arranged to detect a first such partial discharge event. For example if a power cable has been monitored since its initial installation and no partial discharge has previously been detected then detection of any pulses which can be identified as resulting partial discharge could indicate that a new fault has developed resulting in partial discharge. A time window for this first instance of the fault could be established and the measurement signals from the distributed fibre optic sensor, which could be signals indicative of acoustic, thermal and/or magnetic disturbance, could be analysed with respect to the established time window, in a similar fashion as described above.

Figure 8:
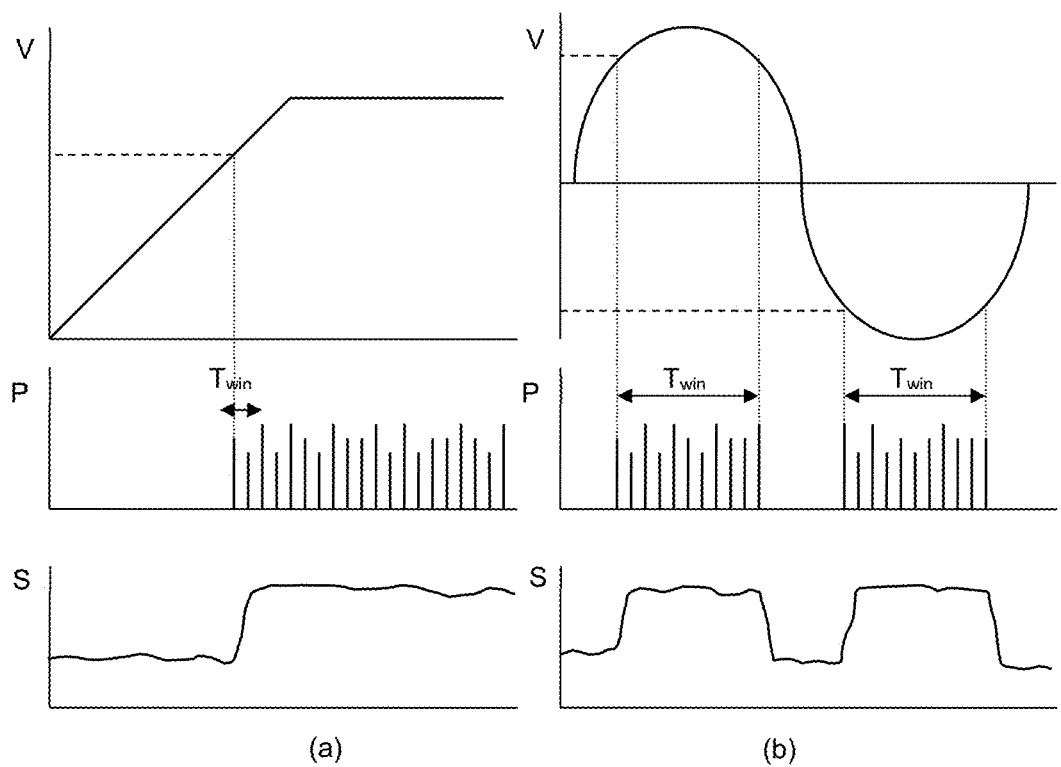
FIG. 8 illustrates the principles of determining the location of a partial discharge fault.

Additionally or alternatively in an off-line method of locating partial discharge a voltage ramp could be applied to the power cable and the partial discharge monitor 701 could detect the time (and voltage) at which pulses from partial discharge are detected as indicated in FIG. 8*a*. FIG. 8*a* shows that the voltage V may be ramped up. For a DC power cable this may normally occur on energisation of the power cable as part of a start-up or restart process, but for an AC power cable this may be a specially applied test signal. If there is a defect in the cable then at a certain voltage level partial discharge may result leading to pulses being detected by the partial discharge monitor 701, as indicated by a pulse count (P) over time. The time at which the pulses due to partial discharge start to be detected can be used to define a time window, based on the expected propagation time of pulses from different parts of the power cable. Measurement signals, S, from the distributed fibre optic sensor may then be analysed based on the known time window, $t_{win}$, to identify any sensing portions that showed an increase in activity, especially in a relatively high frequency band for acoustic or magnetic signals, within the relevant time window that is sustained from then on. FIG. 8*a* illustrates in principle what the form such a signal may take.

FIG. 8*a* illustrates the response from just one partial discharge site. However if there were more than one fault leading to partial discharge then each may become sustaining at a different threshold voltage. If the applied voltage ramp is relatively gradual it could be possible to detect a first set of pulses starting at a first time due to a first fault with a relatively low sustain threshold and then later detect an increase in the number of pulses due to a second fault with a higher voltage threshold, when such threshold is reached. And even if two or more faults at different locations have similar thresholds for the onset of partial discharge the signals from the relevant sensing portions in each location can be identified as correlating strongly in time with the detected pulses due to partial discharge (allowing for pulse propagation time from the relevant locations).

For AC power cables however it may not be necessary to apply a test signal as, in use, the voltage will vary throughout the phase cycle and lead to partial discharge starting and stopping due each phase cycle. As illustrated in FIG. 8*b* as the AC voltage varies the threshold magnitude for sustained partial discharge from a sensing portion may be reached and partial discharge may start, resulting in the detection of pulses by the partial discharge monitor 701. These pulses will cease later in the cycle as the voltage drops again until the threshold magnitude is reached in the other half of the cycle. This will lead to a repeating series of periods of partial discharge and periods of no partial discharge. If this period can be detected by the partial discharge monitor 701, which may involve looking at only the strongest pulses so as to avoid complications with reflected pulses etc, the a series of time windows of partial discharge can be defined—which again may take into account the propagation time within the power cable. The measurement signals can then be analysed to detect a series of disturbances related to the AC voltage frequency that start and stop in general in accordance with the identified time windows. FIG. 8*b* illustrates what the form of such a measurement signal may look like. In this way a partial discharge fault location may be accurately determined in operation of the power cable. Based on the voltage threshold at which the partial discharge occurs and/or the intensity of the detected acoustic or magnetic disturbance and assessment of the severity of the partial discharge fault can be made and, if required, scheduled maintenance or repair can be performed.

Embodiments of the present invention thus provide method and apparatus that can provide fast and accurate fault location in power cables of a power distribution network. Embodiments are particularly suited for medium or high voltage application and can be applied to DC or AC power distribution cables. Such cables typically already contain optical fibre for data transfer and thus one or more of such existing cables could be used—although in some embodiments an optical fibre which has been specifically sensitised to magnetic fields may be employed.

Embodiments of the present invention thus allow the location of catastrophic to be rapidly determined with accuracy and confidence. This is particularly useful for embodiments where the power cable is deployed in a relatively inaccessible location, e.g. deployed subsea or buried in an urban environment say. Detecting the damaged section can reduce the time and effort that would otherwise be expended locating the fault and means that repair of the damaged section can start as soon as possible.

As discussed above analysis of the measurement signals from the sensing fibre can also help provide additional information about the type of fault.

Further analysis of the measurement signals, e.g. acoustic measurement signals, may for instance provide information regarding the cause of the fault.

For example the measurement signals could be analysed to determine whether there was any other acoustic disturbances at the relevant sensing portions of the sensing fibre, i.e. those corresponding to the identified fault location, prior to the fault occurring. For example a significant number of faults, especially for land based power cables, may result from damage caused to the power cable by third party interference, e.g. accidental damage caused by activities such as digging or excavating in the vicinity of the power cable. Identifying that a fault with the power cable occurs due to third party action may be valuable for the power cable owner (or manufacturer) and/or the network operator. This may be useful for liability and/or insurance purposes.

It will be understood that especially in an urban environment a power cable may be deployed along with various other utilities infrastructure, e.g. gas mains or the like. If work is being performed on the gas main say, it is possible that the power cable may be damaged.

Thus if a fault develops then not only could the location of the fault be determined by looking at the measurement signals from a distributed acoustic sensor that correlate with the time window of the fault, but the general acoustic activity at that location could be analysed to determine any possible signals indicative of causation of the fault. This could for instance be significant acoustic intensity in the period shortly before the fault. For example consider that work is being performed to excavate a gas pipeline that runs alongside at least part of a buried power cable. The excavation will result in acoustic disturbances on the acoustic sensing portions in that area, which may be characteristic of excavating. If a catastrophic fault then occurs at that location this may be good evidence that the excavating damaged the power cable in some way. If instead of catastrophic failure the power cable then starts to exhibit partial discharge at that location this may also be good evidence that the work created a defect in the insulation.

Such analysis may be performed for measurement signals recorded immediately prior to the fault occurrence, but in some embodiments data from the distributed fibre optic sensor for a significant period, e.g. months or so, may be recorded and could be analysed for any significant disturbances. Thus acoustic activity in a given location, as detected by a sensing portion of fibre, followed a week later say be a fault occurring at exactly that sensing location may good evidence of causation of the fault.

It should be noted that the embodiments described herein use distributed fibre optic sensing based on detecting and analysing radiation which is Rayleigh backscattered from the optical fibre. Other distributed sensing technologies are known, for instance distributed temperature sensing (DTS) is known which relies on detecting Raman scattering. DTS provides a measure of absolute temperature but requires time averaging to provide a measurement and has lower precision than Rayleigh scattering systems. In general when testing for a damaged or failing cable, e.g. detecting whether there is any partial discharge and/or the location of any partial discharge, it may be desirable to limit the energy within the cable. Especially in subsea environments where the cable is surrounded by water that acts as a heat sink the amount of heating generated at the fault site by applying an electrical stimulus to the cable may be relatively low. Were DTS to be used there may be a need to supply a relatively high amount of energy to the cable to allow sufficient heating to be detectable. As Rayleigh based sensing is more sensitive to temperature changes and in particular provides acoustic sensing a Rayleigh based system may be more sensitive at lower energy levels.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A method of determining the location of a fat in a power cable of a power distribution network comprising:
    monitoring at least one electrical parameter the power distribution network to detect the occurrence of a fault in the power cable and determine at least one time window for the occurrence of the fault; and further comprising;
    taking a first set of measurement signals obtained by a distributed fibre optic sensor having a sensing optical fibre deployed along the path of said power cable;
    wherein the first set of measurement signals comprise signals indicative of the extent of any disturbances on each of a plurality of longitudinal sensing portions of the sensing fibre over a known time period;
    analysing the first setoff measurement signals based on said at least on time window for measurement signals indicative of a fault in the power cable; and
    identifying the location of the fault in the power cable based on the location of one or more longitudinal sensing portions of the sensing fibre giving rise to the measurement signals indicative of a fault in the power cable.

2. A method as claimed in claim 1 wherein the first set of measurement signals comprise signals indicative of the extent of any acoustic disturbances on the longitudinal sensing portions of the sensing fibre.

3. A method as claimed in claim 1 wherein the sensing fibre comprises a magnetically sensitized optical fibre and wherein the first set of measurement signals comprise signals indicative of the extent of any variations in magnetic field acting on the longitudinal sensing portions of the sensing fibre.

4. A method as claimed it wherein the first set of measurement signals comprises a when the measurement signals were acquired.

5. A method as claimed in claim 1 wherein detecting the occurrence of a fault comprises detecting that the at least one electrical; parameter exhibits a fault characteristic and determining at least one time window for the occurrence of the fault comprises defining at least on of a start time and an end time for the time window based on the time that the electrical parameter exhibits the fault characteristic.

6. A method as claimed in claim 5 wherein the at least one electrical parameter comprises a state of a circuit breaker and the fault characteristic is the circuit breaker opening.

7. A method as claimed in claim 5 wherein the at least one electrical parameter comprises a state of a control signal for a circuit breaker and the fault characteristic is the issuance of a control signal to command the circuit breaker to open.

8. A method as claimed in claim 5 wherein the at least one electrical parameter comprises a voltage and/or current through the power cable.

9. A method as claimed in claim 5 wherein said start lime and said end time for the time window are defined such that the time window has a predetermined duration.

10. A method as claimed in claim 1 wherein analysing the first set of measurement signals based on said at least one time window for measurement signals indicative of a fault in the power cable comprises identify ng any measurement signals having a significant change during the time window and identifying the relevant sensing portions as a candidate fault location wherein said significant change is indicative of at least one of an intense acoustic impulse, a rapid change in temperature and/or a sudden variation in magnetic field.

11. A method as claimed in 10 further comprising analysing the evolution of measurement signals during and/or after the time window from the sensing portions at said candidate fault location to detect a characteristic fault signal and categorising the type of fault based on the characteristic fault signal.

12. A method as claimed in claim 1 wherein the first set of measurement signals comprise signals indicative of the extent of any acoustic disturbances on the longitudinal sensing portions of the sensing fibre and wherein analysing the first set of measurement signals based on said at least one time window for measurement signals indicative of a fault in the power cable comprises analysing the measurement signals for an acoustic disturbance propagating in both directions along the power cable that originates from a first location during said time window.

13. A method as claimed in claim 1 wherein monitoring at least one electrical parameter of the power distribution network to detect the occurrence of a fault in the power cable comprise detecting the occurrence of partial discharge.

14. A method as claimed in claim 13 wherein the method comprises applying a ramp voltage to the cable and monitoring the current an for voltage of the cable to detect electrical pulses associated with partial discharge and determining an end time for said time window for the occurrence of the fault based on the time at which said electrical pulses start to be detected.

15. A method as claimed in claim 14 wherein the start time of said time window is determined based on the expected propagation speed of pulses in the power cable.

16. A method as claimed in claim 13, wherein the method comprises monitoring the current and/or voltage of the cable to detect electrical pulses associated with partial discharge and operating the power cable with an AC voltage and determining at least one time window for each AC cycle based on the duration over which said electrical pulses are detected in each AC cycle.

17. A method as claimed in claim 16 wherein analysing the first set of measurement signals for measurement signals indicative of a fault in the power cable comprises identifying a measurement signal for a sensing portion that exhibits a pattern of increased activity that starts and ends in correspondence with the at least one time window.

18. A method as claimed in claim 1 wherein the power cable is a submarine power cable.

19. An apparatus for locating the location of a fault power cable of a power distribution network comprising:
   a monitor for monitoring at least one electrical parameter of the power distribution network to detect the occurrence of a fault in the power cable and determine at least one time window for the occurrence e fault; and
   a fault locator configured to analyse a first set of measurement signals obtained by a distributed fibre optic sensor having a sensing optical fibre deployed along the path of said power cable;
   wherein the first set of measurement signals comprise signals indicative of the extent of any disturbances on each of a plurality of longitudinal sensing portions of the fibre over a known time period; and
   wherein said fault locator comprises a processor configured to:
      analyse the first set of measurement signals based on said at least one time window for measurement signals indicative of a fault in the power cable; and
      identify the location of the fault in the power cable based on the location of one or more longitudinal sensing portions of the sensing fibre giving rise to the measurement signals indicative of a fault in the power cable.

20. An apparatus as claimed in claim 19 comprising a timer for applying a time stamp to the measurement signals indicating when the measurement signals were acquired.

21. A non-transitory computer-readable medium comprising instructions for causing a suitable processor to perform operations, the operations comprising:
   monitoring at least one electrical parameter of a power distribution network to detect an occurrence of a limit in a power cable and determine at least one time window for the occurrence of the fault; and further comprising:
   receiving a first set of measurement signals obtained by a distributed fibre optic sensor having a sensing optical fibre deployed along the path of said power cable:
   wherein the first set of measurement signals comprise signals indicative of the extent of any disturbances on each of a plurality of longitudinal sensing portions of the sensing fibre over a known time period;
   analysing the first set of measurement signals based on said at least one time window for measurement signals indicative of a fault in the power cable; and
   identifying the location in the power cable based on the location of one or more longitudinal sensing portions of the sensing fibre giving rise to the measurement signals indicative of a fault in the power cable.

* * * * *